(12) United States Patent
Akaogi et al.

(10) Patent No.: US 6,212,108 B1
(45) Date of Patent: Apr. 3, 2001

(54) DISTRIBUTED VOLTAGE CHARGE CIRCUITS TO REDUCE SENSING TIME IN A MEMORY DEVICE

(75) Inventors: Takao Akaogi, Cupertino; Lee Edward Cleveland, Santa Clara, both of CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/490,340

(22) Filed: Jan. 24, 2000

(51) Int. Cl.$^7$ .................................................. G11C 7/00
(52) U.S. Cl. ...................... 365/189.09; 365/196
(58) Field of Search ..................... 365/189.09, 230.06, 365/196, 207

(56) References Cited

U.S. PATENT DOCUMENTS 4,796,230 * 1/1989 Young ............................... 365/189
5,132,933 * 7/1992 Schreck ............................ 365/226
5,774,395 * 6/1998 Richart et al. .................. 365/185.2

* cited by examiner

Primary Examiner—David Nelms
Assistant Examiner—Thong Le
(74) Attorney, Agent, or Firm—Brinks Hofer Gilson & Lione

(57) ABSTRACT

A memory device (100) includes a core cell array (102), a sense amplifier circuit (110), data lines (120), each having a length. The memory device further includes bit lines (118) extending from the core cell array and a selection circuit (106) configured to selectively couple a bit line to a data line in response to an input address. Bias circuits (130) are distributed along the length of the data lines and are configured to apply an initial voltage to the data line, reducing the read access time of the memory device. The bias circuits 130 may be positioned to accommodate varying lengths of the data lines and varying capacitance of the data lines.

20 Claims, 3 Drawing Sheets

DISTRIBUTED VOLTAGE CHARGE CIRCUITS TO REDUCE SENSING TIME IN A MEMORY DEVICE

BACKGROUND OF THE INVENTION

The present invention relates generally to semiconductor memory devices. More particularly, the present invention relates to reducing the time required to read data from a semiconductor memory integrated circuit.

In conventional designs for memory circuits, bit lines extend from the core cell array to permit the data stored in the individual core cells to be sensed by a sense amplifier. Select transistors are coupled between the bit lines and data lines. When a column of core cells on the bit line is selected by the address supplied to the memory device, the select transistors associated with that column are turned on, coupling the bit line and the data line. The selected core cell draws a current which is conveyed through the bit line, select transistor and data line to a sense amplifier which detects the state of the core cell.

In some memory devices, the bit lines and the data lines can have a heavy capacitive load. These lines cross many other lines of the circuit in the selection circuit and other circuits. In some designs, the data lines can be very long between the select transistors and the sense amplifiers, and may even be routed across the length of the integrated circuit containing the memory device. Because the current drawn by the core cell is small, on the order of a few microamps, and because the resistive-capacitive (RC) time constant of the bit line and data line can be large, the variation of the voltage on these lines due to the core cell current can be very slow.

It is desirable to speed up the voltage transition on the bit line and the data line to reduce the read access time of the memory. Faster memory access times are always preferred. The time required to sense the state of the selected core cell is a key component of the read access time. If this sensing time can be reduced, the performance of the entire memory device is improved.

It is known to improve the speed of some logic circuits by pre-charging a node to a predetermined voltage. When a voltage to be detected is subsequently applied, the pre-charging is released and the node voltage is driven to its active level. A sensing circuit such as an operational amplifier compares the active level with a threshold voltage and produces an output.

Pre-charging a data line or a bit line has had only a limited effect however, particularly in large memories. In a large integrated circuit, the capacitive loading on the data line and the bit line is so great that it even slows down the pre-charging operation. The pre-charging circuit typically cannot supply enough current to rapidly pre-charge a bit line or data line in a memory circuit.

Accordingly, there is a need in the art for a circuit and method which reduces the read access time of a semiconductor memory.

BRIEF SUMMARY OF THE INVENTION

By way of example only, a memory device in accordance with the present invention includes distributed bias circuits for charging the data lines or bit lines of a memory to an initial voltage. Several bias circuits are distributed along the length of the data line. This reduces the effect of the distributed capacitance of the data line. A control signal is provided to the bias circuits to initiate charging of the data line and to isolate the bias circuits from the data line when the associated bit line is selected for reading. In other embodiments, bias circuits are applied to the bit lines themselves to reduce the voltage transition time on those nodes.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
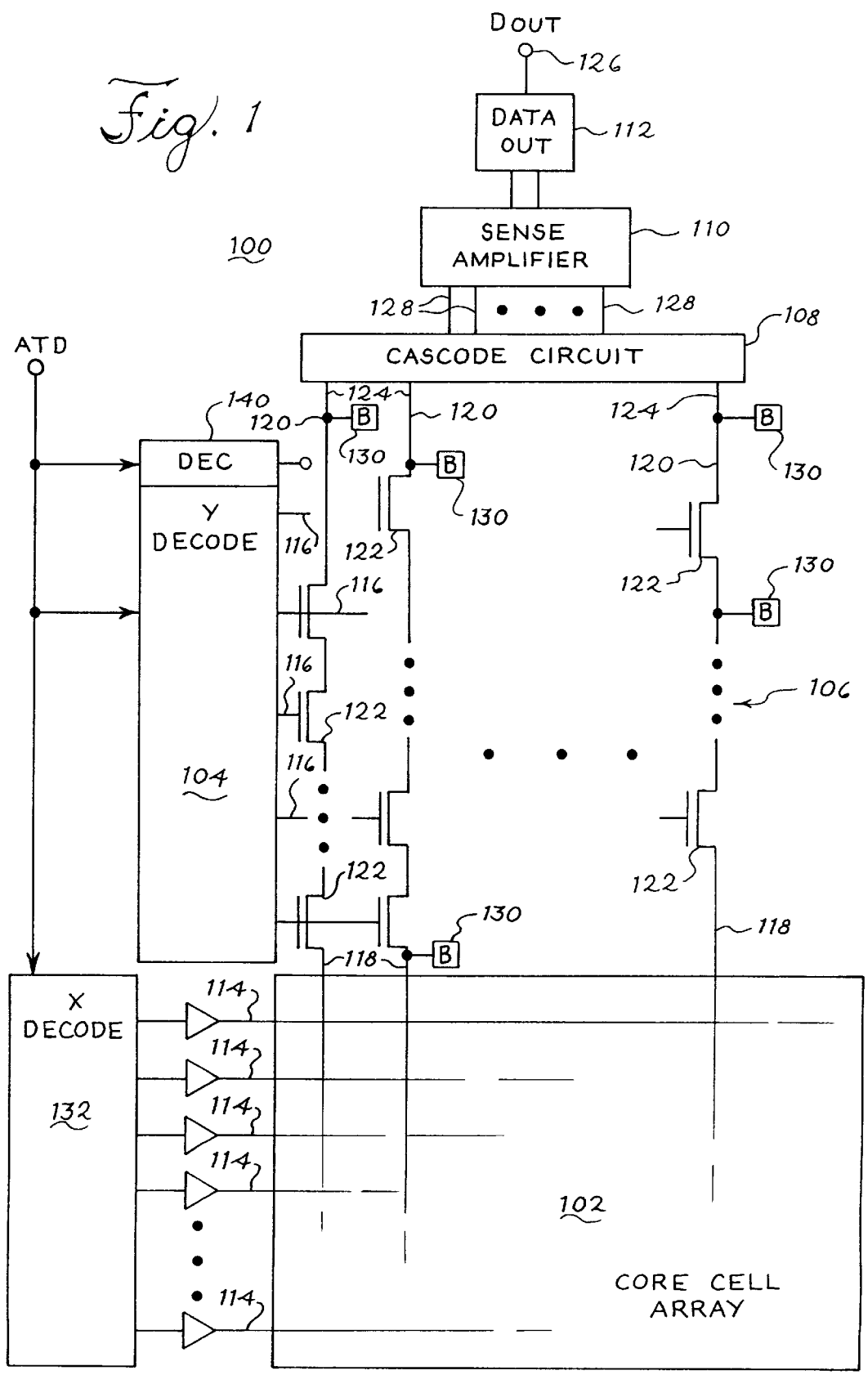
FIG. 1 is a block diagram of a memory device.

Referring now to FIG. 1, it shows a block diagram of a memory device 100. The memory device 100 may be any suitable memory device. However, in the illustrated embodiment, the memory device 100 is a flash memory capable of storing data at any addressed location and subsequently reading the data from the addressed location. The memory device 100 is embodied as a semiconductor integrated circuit having address inputs for receiving address data, data inputs for receiving data for storage, data outputs for providing retrieved data and control inputs for receiving control signals.

The memory device 100 includes a core cell array 102, an X decoder 132, a Y decoder 104, a selection circuit 106, a cascode circuit 108, a sense amplifier 110 and a data out circuit 112. The core cell array 102 comprises a plurality of core cells configured for storing data as one or more binary bits. Each core cell is located at the intersection of a word line 114 and a bit line 118. The word lines 114 define rows of the core cell array 102 and the bit lines 118 define columns of the array 102. Each storage location of the core cell array 102 is independently addressable.

As is known in the art, the core cell array 102 may be divided into units such as sectors, banks, etc. In the embodiment of FIG. 1 the core cell array 102 contains a plurality of non-volatile flash memory cells. However, the principles described herein can be applied to memory devices incorporating dynamic random access memory (DRAM), static RAM (SRAM) and other types of memory as well.

The X decoder 132 decodes an input address received at the memory device 100 and selects a single word line 114. A word line 114 is selected by being driven to a logic high level. All other word lines remain de-selected and at the logic low level. Any suitable type of X decoder 132 may be used.

Similarly, the Y decoder selects a single column of the core cell array 102. The Y decoder 104 responds to the input address received at the memory device 100 to activate a single select line 116. By activating the select line, a single path through the selection circuit 106 is defined.

The plurality of bit lines 118 extend from the core cell array 102. Each bit line 118 is connected to a column of core cells of the core cell array 102. When one core cell of a column of core cells is activated by having its word line 114 driven high, that selected core cell turns on and begins drawing current in the bit line 118. The bit line current is on the order of a few hundred microamps. Generally speaking, the bit line current has a first value if the core cell stores a logic 0 value and a second value if the core cell stores a logic 1.

The selection circuit 106 couples the circuit in one bit line 118 to the cascode circuit 108. The selection circuit 106 includes a plurality of transistors 122, each of which has its gate controlled by a select line 116 driven by the Y decoder 104. Only when each of the transistors 122 between a bit line 118 and a data line 120 is turned on by having its select line 116 driven high is a current path completed between the bit line 118 and the data line 120. The Y decoder 104 insures that only 1 path can be completed through the selection circuit 106.

The data lines 120 each have a length. In some applications, the length of the data lines may all be uniform and relatively short. In other applications, the lengths of the data lines 120 may all be relatively uniform and relatively long. In still other applications, the lengths of the data lines 120 may vary greatly from those in the short two rows of the line. The longer data lines 120 experience greater capacitance than shorter data lines 120. While generally fabricated in metal deposited on the surface of an integrated circuit containing the memory device 100, the data lines 120 have a finite resistance. The resistance is proportional to the length of each individual data line. As a result, each individual data line has a definite resistance-capacitance (RC) time constant, which relates to the amount of time required to charge and discharge the capacitance of the data line 120. The lengths of the data lines depend on many factors, including the particular topological layout of the memory device 100, the interconnect layer, such as first metal, second metal, etc. in which the data lines 120 are formed, etc. As a result, the capacitance which must be charged and discharged by the bit line current in any particular column of the memory device 100 may vary greatly across the memory device.

The cascode circuit 108 is connected to one end 124 of each data line 120. The cascode circuit 108 operates to detect the bit line current in the data line 120, provide impedance matching, and current amplification. The bit line current information is then provided to the sense amplifier 110. The sense amplifier 110 detects the level of the bit line current and forms a decision as to whether the uniquely addressed core cell stores a logic 0 or a logic 1. The result of this determination is provided to the data out circuit 112. The data out circuit 126 drives an output 126 of the memory device 100.

The sense amplifier 110 operates by comparing a voltage on lines 128 with a reference voltage. In order to reduce the time necessary for the sense amplifier 110 to determine the state of the selected core cell, the data lines 120 may be charged to an initial voltage. In one example, the initial voltage approximates the threshold voltage used by the sense amplifier. Any deflection in the voltage on the data line 120 caused by the bit line current is quickly detected as a differential voltage at the sense amplifier, which can be presented to the data out circuit as valid data. By charging the voltage on the data line 120 to the initial voltage, the time necessary to charge or discharge the data line is reduced. This reduces the overall read access time of the memory device 100. In accordance with the present invention, in order to reduce the time necessary to detect a voltage deflection on the data lines 120, bias circuits 130 are distributed along the length of the data lines and configured to apply an initial voltage to the data line 120. Structure and operation of the bias circuits will be described below in conjunction with FIG. 3. Because the length of the individual data lines 120 varies from data line to data line, the positioning and number of bias circuits 112 associated with each data line varies. Further, because the capacitive loading along the length of the data lines 120 may vary from the end 124 of the data line at the cascode circuit 108 to the final transistor 122 of the selection circuit 106, the bias circuits 130 may be positioned suitably anywhere along the length of the data lines 120. Further, the bias circuits 130 may be positioned at nodes within the selection circuit 106, as is illustrated at the right center of FIG. 1. Still further, bias circuits 130 may be associated with one or more bit lines 118 extending from the core cell array, as is illustrated in the lower center of FIG. 1. Proper placement of the bias circuits 130 may be determined empirically by taking into consideration the topological layout of the memory device 100, capacitive loading on various interconnect layers and other circuit factors.

Thus, in the memory device 100, the bias circuits 130 operate to charge data lines of the memory device 100 to an initial voltage at a plurality of locations along lengths of the data lines 120. The locations may be chosen empirically, by circuit analysis or otherwise. The sense amplifier 110 detects a voltage variation from the initial voltage on one data line. The sense amplifier 110 further senses the voltage variation to read a state of an address core cell of the memory device. The core cell is addressed by receiving an input address uniquely associated with the core cell and decoding the Y decoder 104 and the X decoder 132 in the input address to identify one or more data lines 120 for charging. Charging the data lines 120 can be done by any suitable method. For example, the data lines 120 may be charged at uniformly spaced locations along the length of the data lines from the ends 124 of the data lines near the cascode circuit 108 to the end of the data line at the selection circuit 106. At another example, the data line may be charged at locations associated with capacitance or other unusually large capacitance along the length of the data lines.

Figure 2:
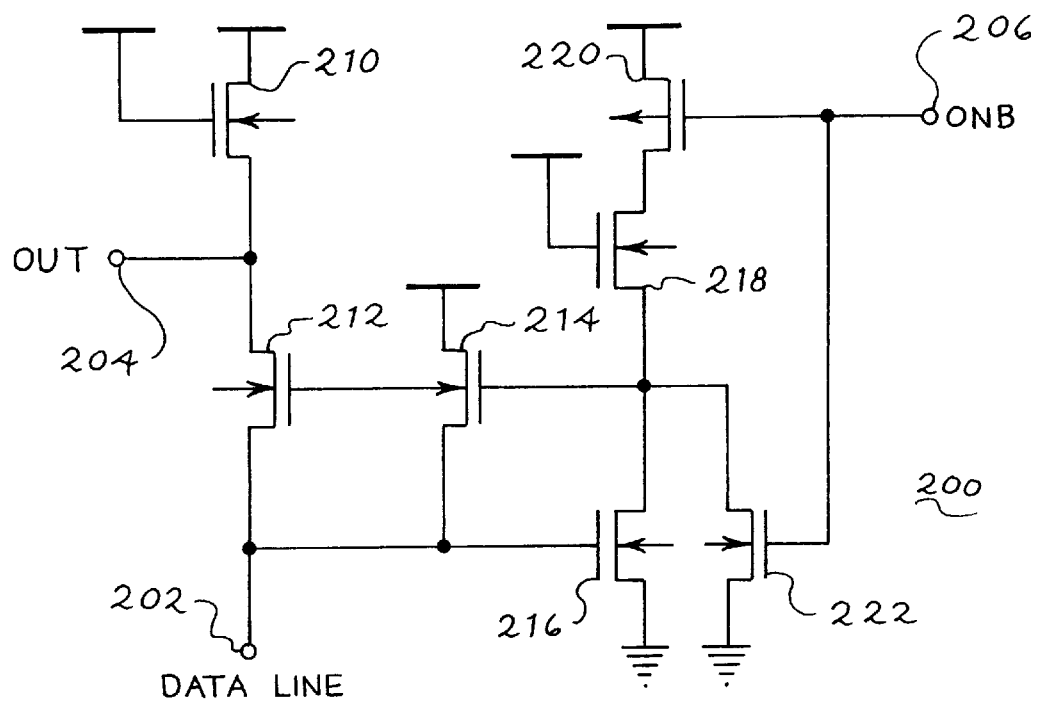
FIG. 2 is a schematic diagram of a portion of the cascode circuit of FIG. 1.

Referring now to FIG. 2, it shows a cascode element 200 which forms a portion of the cascode circuit 106 of FIG. 1. The cascode element 200 connects to the data line at a node 202 and connects to the sense amplifier at a node 204.

Beginning at the output 204, the cascode element 200 includes a diode connected transistor 210, a transistor 212 which is connected as a current mirror with another transistor 214, a bias transistor 216, a pass transistor 218 and a first enable transistor 220 and a second enable transistor 222. The first enable transistor 220 is a P-channel transistor. All other transistors are N-channel transistors.

The cascode element 200 is active when the cascode enable signal received at the cascode enable input 206 is a logic low level. In that case, the second enable transistor 222 is turned off and the first enable transistor 220 is turned on. A current flows in the leg including transistor 218 and transistor 216, establishing a bias voltage on the gate of transistor 214 and transistor 212. For a current signal received at the input 202 from the data line, an output current signal is provided to the output 204, the transistor 212 operates at a cascode transistor having low input impedance and some current amplification.

The cascode element 206 is disabled by driving the cascode enable signal at the cascode enable input to a logic high level. This turns on the second enable transistor 222 and turns off the first enable transistor 220. Turning off the first enable transistor 220 interrupts the flow of current in the leg including transistor 218 and transistor 216. Turning on the second enable transistor 222 pulls the gate of transistor 214 and transistor 212 to ground, turning off these transistors. Thus, the cascode circuit 106 including the cascode element 200 is configured to selectively isolate the data line 120 from the initial voltage in response to the cascode enable signal. If the cascode enable signal is not provided at the input 206 this particular cascode element is disabled and the data line at the input 202 is disconnected from the sense amplifier at the output 204. In this manner, the connection of individual data lines 120 to the sense amplifier 110 is controlled using the cascode enable signals. Further, the amount of standby current drawn by the cascode circuit 108 may be reduced by disabling unused cascode elements 200 in response to the particular input address received by the memory device 100. In this application, the cascode enable signal at the cascode enable input 206 is derived from the Y decoder 104 and the X decoder 132.

Figure 3:
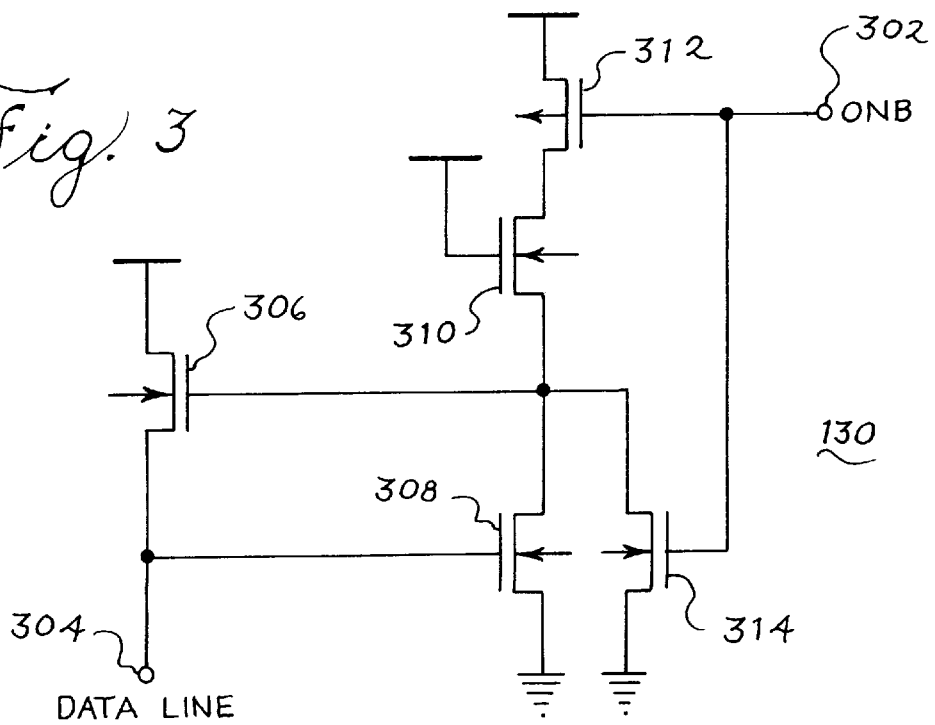
FIG. 3 is a schematic of the bias circuit of FIG. 1.

FIG. 3 illustrates a bias circuit 130 for use in the memory device 100 of FIG. 1. The bias circuit 130 has an enable input 302 configured to receive an enable signal. The bias circuit 130 is configured to selectively isolate the data line received at the input 304 from the initial voltage provided by the bias circuit 130 in response to the enable circuit. The bias circuit 130 includes an output transistor 306, a bias transistor 308, a transistor 310, a first enable transistor 312 and a second enable transistor 314. The bias circuit 130 is enabled when the enable signal received at the enable input 302 is low. When the enable signal is low, the first bias transistor 312 is turned on and the second bias transistor 314 is turned off. With the first bias transistor 312 turned on, current is available to flow in the leg including transistor 310 and transistor 308. A bias voltage is formed at the gate of the transistor 306. The source of transistor 306 is coupled directly to the data line at node 304. Thus, the bias circuit 130, including the transistor 306, applies an initial voltage to the data line 120 when the enable signal is received at the enable input 302. This initial voltage operates to charge the data line to a predetermined level to speed up sensing of the voltage level on the data line 120. When the enable signal is removed from the enable input 302, the first enable transistor 312 is turned off and the second enable transistor is turned on. This interrupts the flow of current in the leg including transistors 310 and 308. It further grounds the gate of the transistor 306.

Referring again to FIG. 1, the Y decoder 104 includes a decoding circuit 140. The decoding circuit 140 operates in response to the input address to produce the enable signal required by the bias circuit 130 and the cascode enable signal required by the cascode element 200. Further, in FIG. 1 the X decoder 132, the Y decoder 104 and the decoding circuit 140 receive an address transition detect (ATD) signal. Generation of the ATD signal in a memory device, such as memory device 100, is well known. The ATD signal is produced in response to a transition on any of the input address signals received from the memory device 100. The ATD signal goes high for a predetermined time following an address transition then returns low again.

In the illustrated embodiment, the decoding circuit 140 responds to the ATD signal to produce the enable signal and the cascode enable signal before the selection circuit 106 couples a selected bit line 118 to a select data line 120. In this manner, the cascode elements 200 of the cascode circuit can charge the ends 124 of the data line 120 to the initial voltage. Similarly, the bias circuits 130 can charge the data lines at predetermined locations to the initial voltage. This charging to the initial voltage preferably occurs before the Y decoder 104 generates the select signals on the select lines 116 to operate the selection circuit 106. In order for the cascode circuit to detect a variation of the voltage on the data line 120, the decoding circuit 140 removes the enable signal and the cascode enable signal when the selection circuit couples a selected bit line to a selected data line. Thus, once addressing is complete, the bias circuits 130 are disabled to allow the bit line to allow the cascode circuit circuit to complete the sensing.

Figure 4:
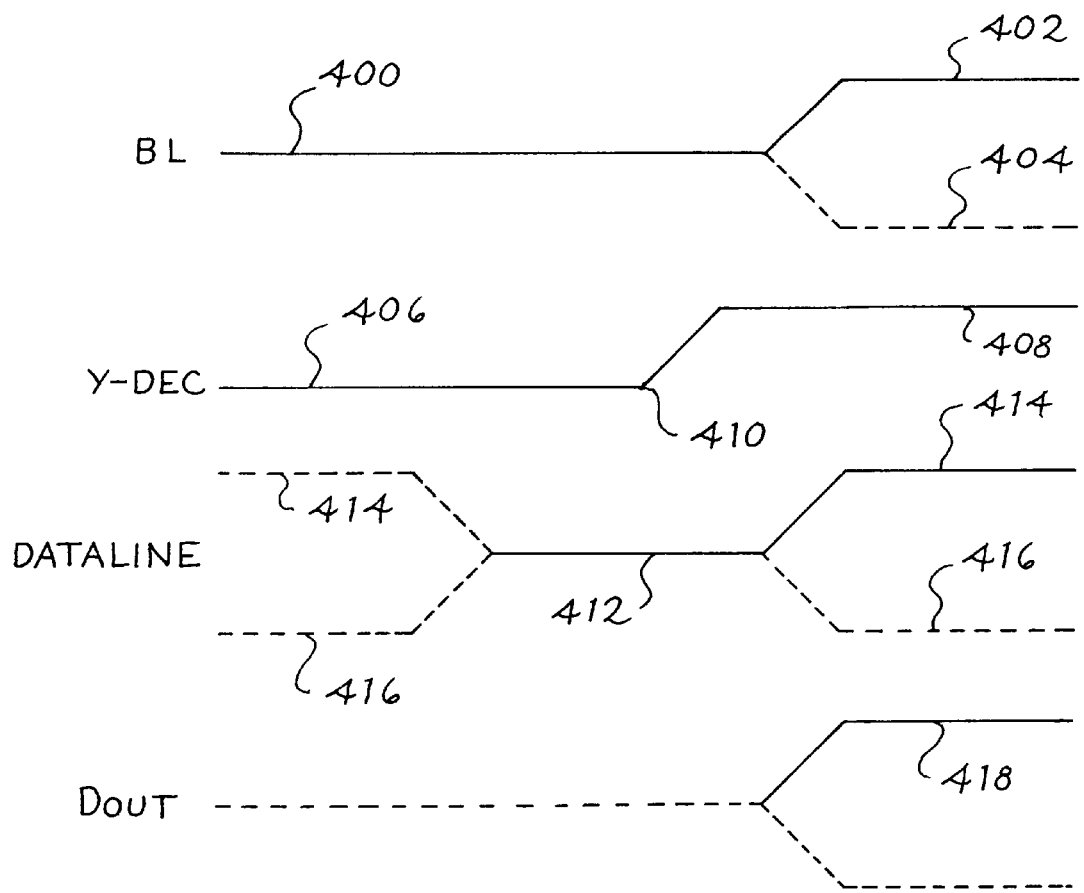
FIG. 4 is a timing diagram illustrating operation of the memory device of FIG. 1.

This operation is illustrated in the timing diagram of FIG. 4. Initially, the bit line voltage (BL) is charged to an intermediate value at point 400. The intermediate value is between a first bit line value corresponding to a logic 0 in the selected memory cell illustrated at point 402 and a second value corresponding to a one stored in the memory cell, illustrated at point 404.

Further, initially the voltage (Y-DEC) on a select line 116 provided by the Y decoder 104 is at a logic low value illustrated at 0.406 of FIG. 4. Upon receipt of an input address, the Y decoder 104 decodes the input address and determines which select line 116 should be driven to the logic high level. This logic high level is illustrated at point 408 following a transition at point 410.

Prior to driving the select line 116 to its logic high level at 0.408, the data line 120 (DATA LINE) is charged to an initial voltage illustrated at point 412 in FIG. 4. Previous to this charging, the DATA LINE may have been a relatively high voltage illustrated at point 414, or a relatively low voltage illustrated at point 416.

As a result of the transition at 0.410 on the select line 116, the bit line (BL) is coupled to the DATA LINE 120. The result is a voltage deflection away from the initial voltage on the DATA LINE to a higher voltage, 0.414 or a lower voltage, 0.416. This voltage deflection is detected by the sense amplifier 110 and results in valid data being presented at the output 126 (voltage Dout) at 0.418. Because of the charging of the DATA LINE 120, the time delay from the transition on the select line 116 (Y-DEC) at 0.410 to the deflection of the DATA LINE at 0.414 is reduced, reducing the read access time of the memory device 100.

From the foregoing, it can be seen that the present invention provides an improved method and apparatus for reducing the read access time of a memory device. Bias circuits are distributed along the length of data lines or bit lines of the memory device. These bias circuits charge the data line and bit lines to an initial voltage. The bias circuits have an enable input to allow them to be activated and deactivated in response to, for example, decoding of the column address of the memory device. The effect is to speed up sensing of the data stored in the core cell selected by the input address.

While a particular embodiment of the present invention has been shown and described, modifications may be made. It is therefore intended in the appended claims to cover all such changes and modifications which fall within the true spirit and scope of the invention.

What is claimed is:

1. A memory device comprising:
   a core cell array;
   a sense amplifier circuit;
   data lines, each data line having a length;
   bit lines extending from the core cell array;
   a selection circuit configured to selectively couple a bit line to a data line in response to an input address; and
   bias circuits distributed along the length of the data lines and configured to apply an initial voltage to the data line, the bias circuits positioned according to at least one of topological layout of the memory device and capacitive loading on the data lines.

2. The memory device of claim 1 wherein the bias circuits comprise an enable input configured to receive an enable signal, the bias circuits configured to selectively isolate the data line from the initial voltage in response to the enable signal.

3. The memory device of claim 2 further comprising cascode circuits coupling ends of the data lines to the sense amplifier circuit and configured to apply the initial voltage to the data line.

4. The memory device of claim 3 wherein the cascode circuits comprise a cascode enable input configured to receive a cascode enable signal, the cascode circuits configured to selectively isolate the data line from the initial voltage in response to the cascode enable signal.

5. The memory device of claim 4 wherein the cascode circuits are further configured to decouple the ends of the data lines from the sense amplifier circuit in response to the cascode enable signal.

6. The memory device of claim 4 further comprising a decoding circuit configured to produce the enable signal and the cascode enable signal.

7. The memory device of claim 6 wherein the decoding circuit produces the enable signal before the selection circuit couples a selected bit line to a selected data line.

8. The memory device of claim 7 wherein the decoding circuit removes the enable signal and the cascode enable signal when the selection circuit couples the selected bit line to the selected data line.

9. A memory device comprising:
a core cell array including a plurality of bit lines;
a selection circuit coupled to the core cell array for selectively coupling one or more bit lines to data lines in response to an input address;
sense amplifiers coupled to the data lines and configured to sense data in the core cell array at locations associated with the input address when the selection circuit couples the one or more bit lines to the data lines; and
one or more bias circuits coupled to plural locations of associated data lines for charging a voltage of the associated data lines to an initial level, the number of the one or more bias circuits being selected according to at least one of topological layout of the memory device and capacitive loading on the data lines.

10. The memory device of claim 9 wherein the one or more bias circuits each bias circuit comprises an enable input configured to receive an enable signal, the each bias circuit configured to selectively decouple the each bias circuit from the data line in response to the enable signal.

11. The memory device of claim 10 further comprising a decoding circuit configured to produce the enable signal.

12. The memory device of claim 11 wherein the decoding circuit produces the enable signal when the selection circuit couples the one or more bit lines to the data lines.

13. The memory device of claim 9 wherein the data lines have a length and wherein the one or more bias circuits are positioned along the length of the data lines to reduce time required for charging the voltage to the initial level along the length of the data lines.

14. The memory device of claim 13 further comprising a cascode circuit coupled between an end of the data lines and the sense amplifiers and configured to charge the data lines near the end to the initial level.

15. The memory device of claim 13 wherein the cascode circuit has an enable input for selectively decoupling the data lines from the sense amplifier.

16. The memory device of claim 9 further comprising bit line bias circuits coupled to each bit line of the plurality of bit lines and configured to charge the each bit line to a predetermined bit line voltage.

17. A method for reducing read access time in a memory device, the method comprising the steps of:
charging data lines of the memory device to an initial voltage at a plurality of locations along lengths of the data lines, the plurality of locations chosen according to at least one of topological layout of the memory device and capacitive loading on the data lines;
detecting a voltage variation from the initial voltage on one data line;
sensing the voltage variation to read a state of an addressed core cell of the memory device.

18. The method of claim 17 further comprising the steps of:
receiving an input address uniquely associated with the core cell of the memory device;
decoding the input address to identify one or more data lines for charging.

19. The method of claim 17 wherein the step of charging data lines of the memory device comprises charging the data lines at uniformly spaced locations along the length of the data lines.

20. The method of claim 17 wherein the step of charging data lines of the memory device comprises charging the data lines at locations associated with capacitance along the length of the data lines.

* * * * *